US011631454B2

(12) United States Patent
Jalan et al.

(10) Patent No.: US 11,631,454 B2
(45) Date of Patent: Apr. 18, 2023

(54) METHODS AND APPARATUS FOR REDUCED AREA CONTROL REGISTER CIRCUIT

(71) Applicant: TEXAS INSTRUMENTS INCORPORATED, Dallas, TX (US)

(72) Inventors: Saket Jalan, Bangalore (IN); Sudesh Chandra Srivastava, Bangalore (IN); Mohammed Nabeel, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/744,412

(22) Filed: Jan. 16, 2020

(65) Prior Publication Data

US 2020/0152261 A1 May 14, 2020

Related U.S. Application Data

(63) Continuation of application No. 15/437,253, filed on Feb. 20, 2017, now Pat. No. 10,559,351.

(51) Int. Cl.
*G11C 11/418* (2006.01)
*G06F 13/16* (2006.01)
(Continued)

(52) U.S. Cl.
CPC ........ *G11C 11/418* (2013.01); *G06F 11/1048* (2013.01); *G06F 13/1668* (2013.01); *G06F 13/4068* (2013.01); *G11C 11/419* (2013.01)

(58) Field of Classification Search
None
See application file for complete search history.

(56) References Cited

U.S. PATENT DOCUMENTS 4,365,332 A * 12/1982 Rice ..................... G06F 11/1008
714/746
4,837,785 A * 6/1989 McAlpine ............. G06F 13/364
370/438
(Continued)

FOREIGN PATENT DOCUMENTS

CN 1116763 A 2/1996
CN 101315598 A 12/2008
CN 103999055 A 8/2014

OTHER PUBLICATIONS

First Office Action dated Nov. 28, 2022, Chinese Application No. 20180140265.x, 24 pages.

*Primary Examiner* — Cynthia Britt
*Assistant Examiner* — Dipakkumar B Gandhi
(74) *Attorney, Agent, or Firm* — Krista Y. Chan; Frank D. Cimino

(57) ABSTRACT

In described examples, an apparatus includes: a set of control registers containing control bits for controlling circuitry coupled to receive register write enable signals and to receive input data; a memory for storing data corresponding to the control bits coupled to receive an address and a memory write enable signal; decode circuitry coupled to output the register write enable signals; a data output bus coupled to receive data from the memory but free from connections to the control registers; and a controller coupled to receive an address, coupled to output the address on an internal address bus, coupled to output a register write enable signal, and coupled to output the memory write enable signal, configured to cause data to be written to a selected control register corresponding to the address received, and to cause the data to be contemporaneously stored at a memory location corresponding to the address received.

20 Claims, 4 Drawing Sheets

(51) Int. Cl.
  *G06F 13/40* (2006.01)
  *G11C 11/419* (2006.01)
  *G06F 11/10* (2006.01)
  *G11C 11/50* (2006.01)

(56) References Cited

U.S. PATENT DOCUMENTS

| | | | | |
|---|---|---|---|---|
| 4,849,979 A | * | 7/1989 | Maccianti | G06F 11/1633 714/41 |
| 5,291,498 A | * | 3/1994 | Jackson | G06F 11/1028 714/753 |
| 5,379,380 A | * | 1/1995 | Mori | G11B 27/034 711/114 |
| 5,521,880 A | | 5/1996 | McClure | |
| 5,537,425 A | * | 7/1996 | Tsou | G06F 11/1016 714/801 |
| 5,539,891 A | * | 7/1996 | Childers | G06F 15/8015 348/262 |
| 5,598,372 A | | 1/1997 | Matsumoto et al. | |
| 5,961,660 A | * | 10/1999 | Capps, Jr. | G06F 11/1048 714/E11.049 |
| 6,188,595 B1 | * | 2/2001 | Chevallier | G11C 5/05 361/760 |
| 6,415,387 B1 | * | 7/2002 | Aguilar | G06F 1/3203 709/203 |
| 9,436,632 B2 | | 9/2016 | Bains et al. | |
| 9,897,650 B2 | * | 2/2018 | Na | G01R 31/31716 |
| 2001/0017076 A1 | * | 8/2001 | Fujita | G10H 7/02 84/603 |
| 2002/0138715 A1 | * | 9/2002 | Minematsu | G06F 9/30134 712/225 |
| 2002/0194435 A1 | | 12/2002 | Yamagami et al. | |
| 2004/0153582 A1 | * | 8/2004 | Oyama | G06F 1/10 710/15 |
| 2005/0278584 A1 | | 12/2005 | Asami et al. | |
| 2006/0026489 A1 | * | 2/2006 | Noda | G06F 11/1068 714/E11.038 |
| 2006/0041702 A1 | | 2/2006 | Greenberger | |
| 2006/0047899 A1 | * | 3/2006 | Iida | G06F 3/0656 711/113 |
| 2007/0067705 A1 | * | 3/2007 | Kim | H03M 13/11 714/801 |
| 2008/0010435 A1 | | 1/2008 | Smith et al. | |
| 2008/0046103 A1 | * | 2/2008 | Ashida | G05B 19/054 700/86 |
| 2008/0133031 A1 | * | 6/2008 | Newman | G05B 19/4183 700/73 |
| 2008/0301401 A1 | | 12/2008 | Honda et al. | |
| 2010/0070825 A1 | * | 3/2010 | Efimov | H03M 13/1182 714/755 |
| 2010/0287397 A1 | * | 11/2010 | Naor | G06F 1/3268 713/324 |
| 2011/0047303 A1 | | 2/2011 | Saito | |
| 2012/0233376 A1 | | 9/2012 | Anbai | |
| 2014/0281284 A1 | * | 9/2014 | Block | G11C 7/1075 711/149 |
| 2015/0067235 A1 | | 3/2015 | Myouga | |
| 2016/0232129 A1 | * | 8/2016 | Tianxiang | G06F 30/34 |
| 2016/0364345 A1 | * | 12/2016 | Jeter | G11C 8/18 |
| 2017/0185541 A1 | * | 6/2017 | Yeh | G06F 13/102 |
| 2018/0095893 A1 | * | 4/2018 | Dooley | G06F 9/3824 |

* cited by examiner

METHODS AND APPARATUS FOR REDUCED AREA CONTROL REGISTER CIRCUIT

CROSS-REFERENCE TO RELATED APPLICATIONS

The present application is a continuation of U.S. patent application Ser. No. 15/437,253, filed Feb. 20, 2017, which is herein incorporated by reference in its entirety.

TECHNICAL FIELD

This relates generally to electronic systems, and more particularly to systems that employ digital control registers for analog, digital, and mixed signal circuits.

BACKGROUND

A broad range of electronic systems employ circuits that require a large number of control signals. Examples of such systems are automotive radar circuits and circuits that combine wireless LAN (local area network) and Bluetooth™ radios commonly included in mobile electronic products. Such circuits typically employ amplifiers, oscillators, filters, low power sleep modes, and other functions that require control. Examples of this control include amplifier gain settings, oscillator frequency settings, filter coefficients, sleep mode enable, and wake up signals. For complex systems this control is typically provided by a microprocessor. Other types of circuits, however, can be employed to provide the control such as a state machine. The number of control bits required for some complex systems can be in excess of 10,000.

The individual bits of all control registers within a system are typically available simultaneously to the circuit being controlled, due to parallel functionality of the circuit being controlled. To enable this simultaneous access of all control bits of all control registers, the control register bits are typically implemented with flip-flops. Other types of storage elements such as latches may be used. Random access memories (RAMs) typically do not provide simultaneous access to all bits and thus are typically not employed as control registers. Random access memories include static RAM and dynamic RAM as well as non-volatile memories such as so called flash memory and memories based on magnetic storage cells.

Control registers are typically implemented with read and "read modify write" capabilities in addition to the capability of being written by a microprocessor or other type of circuit. The read capability is often used to verify that the content of the control registers are correct after being written. The read modify write capability is typically used when only a subset of the bits of a control register are being modified. The read modify write capability is also often used in a multi-processor system where more than one processor can write to the same control registers.

Control registers may be implemented with the capability to retain data during a low power state. This capability is advantageous when restoring system functionality when transitioning from an inactive low power state to normal full power operation.

SUMMARY

In a described example, an apparatus includes: a set of control registers containing control bits for controlling circuitry, the set of control registers coupled to receive register write enable signals from register write enable lines and coupled to receive input data from a register input data bus; a memory for storing data corresponding to the control bits stored in the set of control registers, the memory coupled to receive an address from an internal address bus, coupled to receive memory input data from an input data bus and coupled to receive a memory write enable signal; decode circuitry coupled to receive an address from the internal address bus and to receive a register write enable signal, and coupled to output the register write enable signals; a data output bus coupled to receive data from the memory but free from connections to the control registers; and a controller coupled to receive an address from an address bus, coupled to output the address on the internal address bus, coupled to output the write enable signal, and coupled to output the memory write enable signal, configured to cause data to be written from an input data bus to a selected control register at a control register corresponding to the address received on the address bus, and to cause the data to be written to be contemporaneously stored in the memory at a memory location corresponding to the address received on the address bus.

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled." The terms "line" and "bus" are used herein to refer to connecting elements such as (and not limited to) metal interconnects on an integrated circuit and traces on a circuit board. A bus is typically made of multiple lines. A line or bus coupled to two or more circuit elements may include intervening elements and additional elements that are not illustrated and not described herein. The incorporation of such intervening and additional elements is dependent upon a circuit implantation for a specific application. Examples of intervening and additional elements include and are not limited to buffers to increase signal drive strength and passive elements such as resistors.

Figure 1:
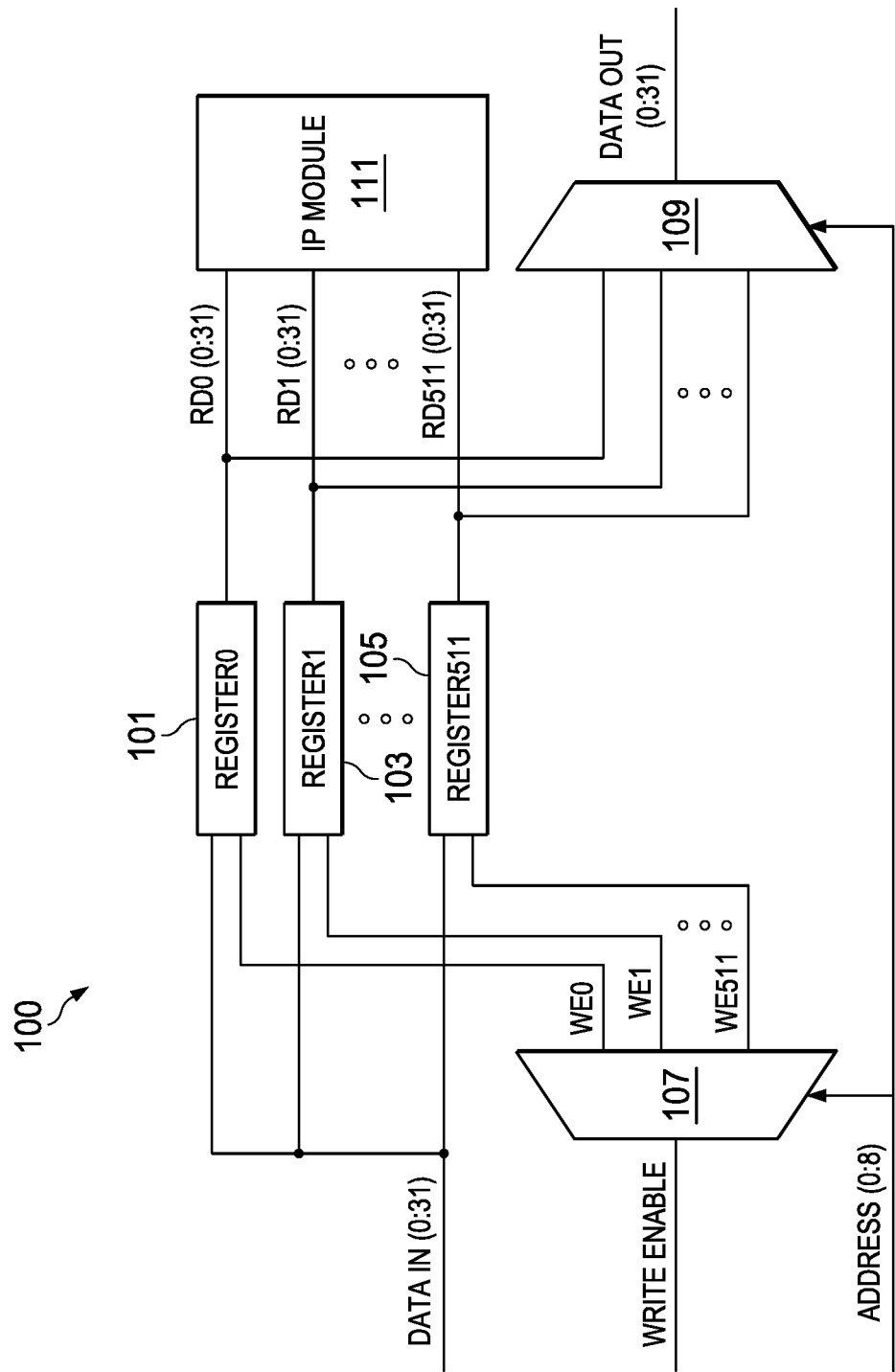
FIG. 1 is a block diagram illustrating an example conventional control register circuit.

FIG. 1 is a block diagram illustrating an example conventional control register circuit 100. Circuit 100 is a typical control register circuit for a system requiring a large number of control bits. The example conventional control register circuit of FIG. 1 can contain 16,384 bits. These bits are arranged such that there are 512 control registers of 32 bits each. In this example, the individual control registers are assigned to an address in the range 0 through 511. The control registers assigned to addresses 0, 1, and 511 are blocks 101, 103, and 105 respectively in FIG. 1 and are labeled "register0," "register1," and "register511", respectively. The 32-bit register output buses labeled "RD0 (0:31)," "RD1 (0:31)," and "RD511 (0:31)" in FIG. 1 are coupled to the data outputs of register1, register2, and register511 respectively. The lines labeled WE0, WE1, and WE511 in FIG. 1 are coupled to the clock inputs of register1, register2, and register511 respectively. The control registers assigned to addresses 2 through 510 as well as buses coupled to the data outputs of these registers and the lines coupled to the clock inputs of these registers are not explicitly illustrated in FIG. 1. However, these registers, buses, and lines are present in FIG. 1 as indicated by the dots between blocks 103 and 105, the dots between buses RD1 (0:31) and RD511 (0:31), and the dots between the lines WE1 and WE511. The data inputs of all 512 control registers of FIG. 1 are coupled to the 32 bit bus labeled "data in (0:31)" of FIG. 1. The data outputs of all the control registers are coupled to the circuit being controlled (block 111 of FIG. 1) labeled "IP module" (intellectual property module). "IP module" is often used in reference to a block of circuitry that is a portion of an integrated circuit, field programmable gate array, or other type of large scale circuit implementation. An example of an IP module (the circuit being controlled, block 111 of FIG. 1) is an automotive radar. Another example is a circuit containing wireless LAN and Bluetooth™ radios. Complex filtering circuitry requires many control bits for filter coefficients and may be another example of the circuitry in the IP Module. Circuitry using local oscillators with variable frequency require many control bits for frequency selection.

In the example control circuitry, the control registers in the example of FIG. 1 are implemented with 32 D-type flip-flops. Other types of storage elements can be used with corresponding changes to the arrangement of circuit 100. The data input of the control registers of FIG. 1 contain 32 bits where the 32 bits are the input of the individual flip-flops of the control registers. The data output of the control registers of FIG. 1 contain 32 bits, where the bits are the output of the individual flip-flops of the control registers. The clock input of the control registers of FIG. 1 are coupled in parallel to the clock inputs of the 32 flip-flops of the individual control registers.

A conventional control register circuit can be implemented with different numbers of control registers and a different number of bits per control register than are illustrated in FIG. 1 and described hereinabove. In addition, some of the control registers of a control register circuit may be implemented with a different number of bits than other control registers in the circuit. The range of addresses assigned to the control registers may not be contiguous, and within a contiguous address range, some addresses may not be assigned to a control register.

The 9 bit bus labeled "address (0:8)" in FIG. 1 is coupled to the select inputs of both the demultiplexer 107 of FIG. 1 and the multiplexer 109 of FIG. 1. An external circuit such as a microprocessor, microcontroller, CPU, DSP, or mixed signal processor (MSP) places the address of a control register to be read from, or written to, on the bus address (0:8). The address on the bus address (0:8) configures the demultiplexer (107 of FIG. 1) to establish a path from the demultiplexer input coupled to the line labeled "write enable" in FIG. 1 to the demultiplexer output line corresponding to the address on bus address (0:8). The demultiplexer outputs coupled to the lines WE0, WE1, and WE511 in FIG. 1 correspond to demultiplexer select addresses 0, 1, and 511 respectively. The demultiplexer outputs corresponding to addresses 2 through 510 are not explicitly illustrated in FIG. 1, but are present as indicated by the dots between the lines WE1 and WE511. The demultiplexer decodes the address on the bus address (0:8) to output a write enable signal to the selected control register. In alternative embodiments the decode function can be implemented by logic other than a demultiplexer.

The address on the bus address (0:8) also configures the multiplexer (109 of FIG. 1) to establish a path from the input of multiplexer 109 corresponding to the address on the bus address (0:8) to the multiplexer output which is coupled to the 32 bit bus labeled "data out (0:31)" in FIG. 1. The multiplexer 109 inputs coupled to the buses RD0 (0:31), RD1 (0:31), and RD511 (0:31) in FIG. 1 correspond to multiplexer select addresses 0, 1, and 511 respectively. (The multiplexer inputs corresponding to addresses 2 through 510 are not explicitly illustrated in FIG. 1, but are present as indicated by the dots between the buses RD1 (0:31) and RD511 (0:31) in FIG. 1.)

For a write operation, an external circuit (not shown) places the address of the control register to be written to on the bus address (0:8) in FIG. 1 and the data to be written into the addressed control register on the bus data in (0:31) in FIG. 1. The external circuit also generates a pulse on the line labeled "write enable" in FIG. 1. The address on bus address (0:8) configures the demultiplexer 107 of FIG. 1 as described hereinabove. The pulse on the line write enable of FIG. 1 propagates through the demultiplexer (107 of FIG. 1) to the clock input of the control register corresponding to the address on bus address (0:8). The pulse on this control register clock input results the data on the bus data in (0:31) to be written to this control register. For example, for a case where the control register to be written is register1 (block 103 of FIG. 1), the address on the bus address (0:8) is the unsigned 9 bit number 1. The address of 1 results in the pulse on the line write enable propagating to the demultiplexer output coupled to the line WE1. The line WE1 is also coupled to the clock input of register1 (block 103). The rising edge of the pulse on WE1 results in the data on the bus data in (0:31) being clocked into the flip-flops of register1.

For a read operation, an external circuit places the address of the control register to be read on the bus address (0:8). This address configures the multiplexer 109 of FIG. 1 as described hereinabove resulting in the data stored in the control register corresponding this address to propagate through the multiplexer to the bus data out (0:31) of FIG. 1. For example, it the case where register1 is to be read, the address on the bus address (0:8) is the unsigned 9 bit number 1. The address of 1 results in the data on the bus RD1 (0:31) to propagate to the output of the multiplexer (109 of FIG. 1) coupled to the bus data out (0:31) of FIG. 1. The bus data out (0:31) is also typically coupled to the data inputs of a microprocessor or other circuit external to FIG. 1.

For a system implemented with a conventional control register circuit such as that illustrated in FIG. 1, additional input signals may be required. Such an additional input signal is a select signal that enables the control register circuit for both read and write operations. In addition, for a control register circuit implemented with registers known as "retention registers," input signals may be required to transition between the retention and normal operation states. These example additional input signals are not further described herein for simplicity of explanation.

The implementation of conventional control register circuits, such as the example illustrated in FIG. 1 results in a large number of lines being routed from the control registers in FIG. 1 to both the IP module (block 111 of FIG. 1) and to the circuit elements internal to the multiplexer (109 of FIG. 1). In a case of a control register circuit containing a large number of bits implemented as part of an integrated circuit (IC), there is typically significant routing congestion due to lines being run from the bits of the control registers to both the IP module (block 111 of FIG. 1) and to the circuit elements of the multiplexer (109 of FIG. 1). This high routing congestion typically results is a significant portion of the IC area allocated to the control register circuit being dedicated to interconnect routing and not containing active circuits. This impact of routing congestion in prior approach control register circuitry results in increased IC unit cost. In addition, in the design process, the high routing congestion results in long run times for the place and route tools that are used to complete a layout for the IC that meets circuit timing requirements ("timing closure"). These long run times may result in increased non-recurring costs associated with the IC development. For some conventional control register circuits, significant routing congestion may prevent timing closure. Additional semiconductor area may have to be allocated to the routing function and additional design process time required to successfully place and route the control circuitry and achieve timing closure. The minimum time needed to read the control bits from the control registers can also be negatively impacted by the length of the many routing channels needed to map all of the control register bits to a single output bus or port, such as the output bus data out (0:31) in FIG. 1.

Figure 2:
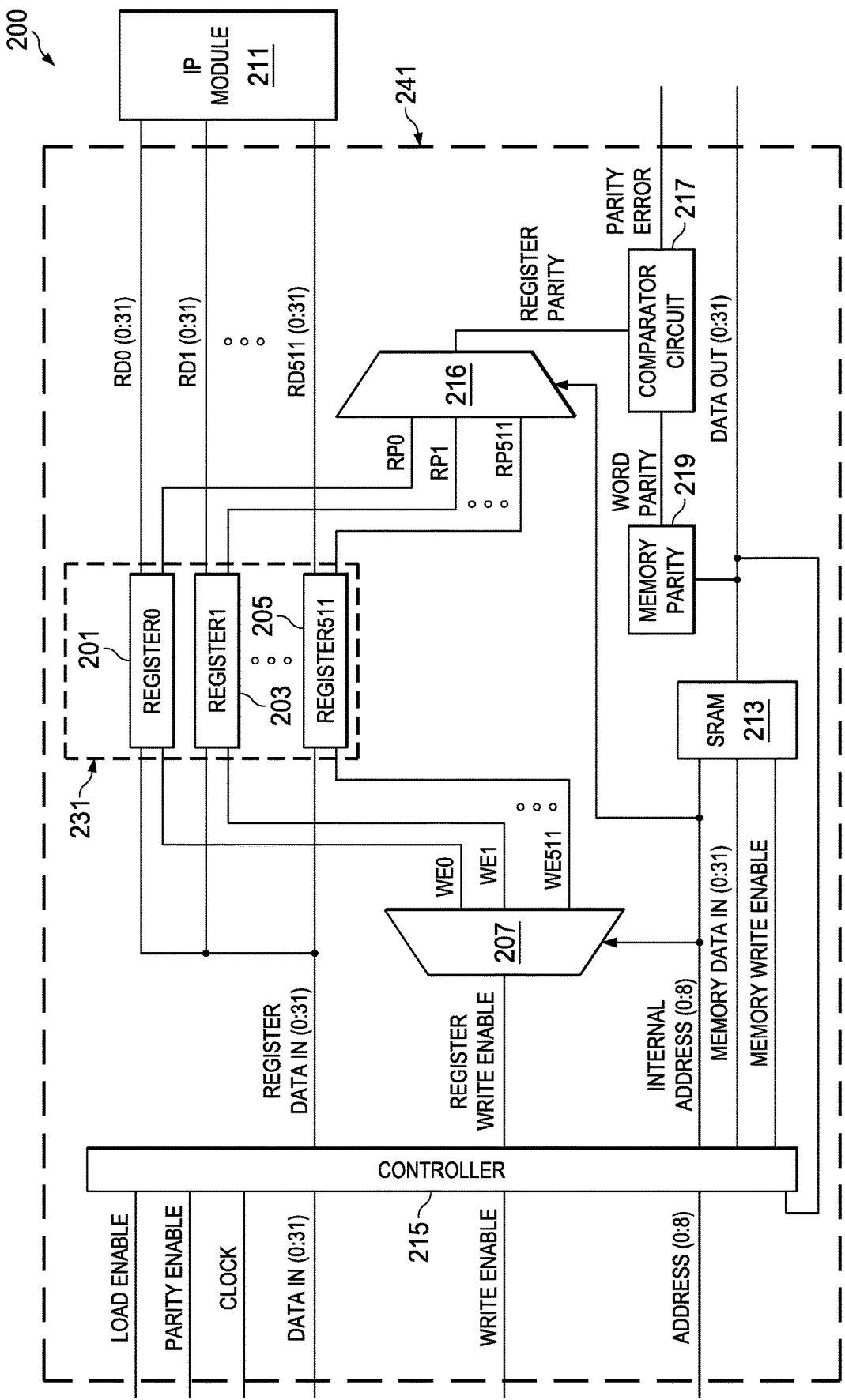
FIG. 2 is a block diagram illustrating an example embodiment control register circuit.

FIG. 2 is a block diagram illustrating a circuit 200 including an example embodiment control register circuit 241. Circuit 200 also includes an example circuit being controlled (block 211 of FIG. 2, labeled "IP module") by the control registers of circuit 241. Circuit 241 is a control register circuit for an example system requiring a large number of control bits. The example control register circuit of FIG. 2 contains 16,384 bits. These bits are arranged such that there are 512 control registers of 32 bits each. The individual control registers are assigned to an address in the range 0 through 511. The control registers assigned to addresses 0, 1, and 511 are blocks 201, 203, and 205 respectively in FIG. 2 and are labeled "register0," "register1," and "register511" respectively. The 32-bit register output buses labeled "RD0 (0:31)," "RD1 (0:31)," and "RD511 (0:31)" in FIG. 2 are coupled to the data outputs of register1, register2, and register511 respectively. The lines labeled WE0, WE1, and WE511 in FIG. 2 are coupled to the clock inputs of register1, register2, and register511 respectively. The control registers assigned to addresses 2 through 510 as well as the buses coupled to the data outputs of these registers and the lines coupled to the clock inputs of these registers are not explicitly illustrated in FIG. 2. However, these registers, buses, and lines are present in FIG. 2 as indicated by the dots between blocks 203 and 205, the dots between buses RD1 (0:31) and RD511 (0:31), and the dots between lines WE1 and WE511. The data inputs of all 512 control registers of FIG. 2 (the "register set" 231) are coupled to the 32 bit bus labeled "register data in (0:31)" of FIG. 2. The data outputs of all the control registers of register set 231 are coupled to the IP module (block 211 of FIG. 2). Examples of the IP module (block 211) are an automotive radar and a circuit containing wireless LAN and Bluetooth™ radios. Filter circuitry can require many control bits, as can programmable oscillators, and various receivers and transmitters can require significant control bits to set local oscillator frequencies, to store variable frequencies, and to store sampling frequencies. Other functions requiring control bits can benefit from the use of the embodiments.

The individual control registers in the example of FIG. 2 are implemented with 32 D-type flip-flops. Other types of storage elements can be used with corresponding changes to the arrangement of circuit 241. The data input of the individual control registers of FIG. 2 contains 32 bits where the bits are the data input of the individual flip-flops of the control registers. The data outputs of the control registers of FIG. 2 contain 32 bits where the bits are the data output of the individual flip-flops of the control registers. The clock input of the control registers of FIG. 2 is coupled in parallel to the clock inputs of the individual 32 flip-flops of the control registers.

Alternative embodiments can be implemented with different numbers of control registers and having a different numbers of bits per control register than are illustrated in FIG. 2, with corresponding modifications to circuit 241. Alternative embodiments can be implemented with corresponding modifications to circuit 241 where individual control registers may be implemented with differing numbers flip-flops. These control registers can be implemented by omitting any one or more of the flip-flops of a register. Alternative embodiments can be implemented with corresponding modifications to circuit 241 where the range of addresses assigned to the control registers may not be contiguous, and within a contiguous address range each address may not be assigned to a control register.

The example embodiment control register circuit 241 of FIG. 2 has three modes of operation. The modes are "normal," "bulk data restoration," and "bulk data error check." The states of the signals on the lines "load enable" and "parity enable" in FIG. 2 determine which of the three modes is active at a specific time. The lines load enable and parity enable are coupled to inputs of the "controller" (block 215 of FIG. 2). The states of signals on the lines load enable and parity enable are set by a circuit external to FIG. 2, such as a microprocessor. When the signals on the lines load enable and parity enable are both low, circuit 241 operates in the normal mode. For all signals described herein, unless otherwise stated, the de-asserted state is a logic low level, and the asserted state is a logic high level. When the signal on the line load enable is high and the signal on the line parity enable is low, circuit 241 operates in the bulk data restoration mode. When the signal on the line load enable is low and the signal on the line parity enable is high, circuit 241 operates in the bulk data error check mode. Alternative example embodiments can be implemented without the bulk data error check mode as described herein below.

When the example embodiment of FIG. 2 is operating in the normal mode, an external circuit (such as a microprocessor or other controller) can perform read operations from and write operations to the example embodiment control register circuit 241 of FIG. 2. Any number of individual write operations, and any number of individual read operations can be performed. These read and write operations can occur in any order of a write followed by a read or another write operation. Additionally, a read operation can be followed by a write or another read operation. Each of these read and write operations is for a single address. Each consecutive operation (read or write) can occur for different address and for any address in the range described hereinabove. Read modify write operations can also be performed with one read operation followed by one write operation with both operations for the same address. For simplicity of explanation the read modify write operation is not described in detail herein.

When the example embodiment of FIG. 2 is operating in the normal mode, the control register circuit (241 of FIG. 2)

performs the functions now described when either a read or write operation is performed. The state of the 32 bit data word on the bus labeled "data in (0:30" in FIG. 2, coupled to inputs of block 215, the controller, and is then output by block 215 to both the bus labeled "register data in (0:30" in FIG. 2 and the bus labeled "memory data in (0:31)" in FIG. 2. Both the bus register data in (0:31) and the bus memory data in (0:31) are coupled to outputs of block 215. A change in state of the data word on the bus data in (0:31) is output by block 215 approximately simultaneously to both the bus register data in (0:31) and the bus memory data in (0:31). The state of the 9 bit address on the bus labeled "address (0:8)" in FIG. 2, coupled to inputs of block 215, is output by block 215 to the bus labeled "internal address (0:8)" in FIG. 2. The bus internal address 0:8) is coupled to outputs of block 215 in FIG. 2. The state of the signal on the line labeled "write enable" in FIG. 2, coupled to an input of block 215, is output to both the lines labeled "register write enable" in FIG. 2 and "memory write enable" in FIG. 2. The lines register write enable and memory write enable are coupled to outputs of block 215 in FIG. 2. A change in state of the signal on the line write enable of FIG. 2 is output by block 215 approximately simultaneously to both the line memory write enable and the line register write enable.

When circuit 241 of FIG. 2 is operating in the normal mode and a write operation occurs, an external circuit performs the following operations: it places the address of the control register of register set 231 to be written on the bus address (0:8) in FIG. 2; it places the data to be written into this control register on the bus data in (0:31) in FIG. 2; and it generates a pulse on the line labeled "write enable" in FIG. 2. As described hereinabove, the pulse on line write enable is output by controller 215 to both the line register write enable and to the line memory write enable of FIG. 2. Also as described hereinabove, the data word on the busla-beled bus data in (0:31) is output to the buses labeled register data in (0:31) and memory data in (0:31) by block 215. Further described hereinabove the bus address (0:8) is output to the bus internal address (0:8) by block 215. The bus internal address (0:8) is coupled to the select inputs of the demultiplexer 207 of FIG. 2 and to the address inputs of the block "SRAM" 213 in FIG. 2. Block 213 in FIG. 2 is a static RAM (SRAM) memory. The address on the bus internal address (0:8) configures the demultiplexer (block 207 of FIG. 2) to establish a path from the demultiplexer input coupled to the line register write enable in FIG. 2 to the demultiplexer output corresponding the address on bus internal address (0:8). The demultiplexer outputs coupled to the lines WE0, WE1, and WE511 in FIG. 2 correspond to addresses 0, 1, and 511, respectively. The demultiplexer outputs corresponding to addresses 2 through 510 are not explicitly illustrated in FIG. 2, but are present as indicated by the dots between the lines WE1 and WE511. The demultiplexer 207 performs a decoding operation to decode the address on the bus internal address (0:8) and to output the signal on the register write enable line to the clock input for a selected control register. In alternative embodiments, other forms of logic circuitry can replace the demultiplexer to perform a decoding function of the address on the bus internal address (0:8).

The hereinabove described pulse on the line register write enable of FIG. 2 propagates through the demultiplexer (207 of FIG. 2) to the clock input of the control register of register set 231 corresponding to the address on bus internal address (0:8). The pulse on this control register clock input results in the data on the bus register data in (0:31) being written to this control register. The pulse on the line memory write enable of FIG. 2 results in the data on the bus memory data in (0:31) being written to the word location in the SRAM (block 213 of FIG. 2) corresponding to the address on the bus internal address (0:8). The line memory write enable is coupled to the write enable input of the SRAM (block 213). The bus memory data in (0:31) is coupled to the data inputs of the SRAM (block 213). The SRAM (block 213) is organized with 512 words of 32 bits each. In this example, these words corresponds to an address in the range 0 to 511.

For example, for a case where the control register to be written is register 1 (block 203 of FIG. 2), the address on the buses address (0:8) and internal address (0:8) is the unsigned 9 bit number 1. This address of 1 results in the pulse on the line register write enable propagating to the demultiplexer output coupled to the line WE1. The line WE1 is also coupled to the clock input of register1 (block 203). In this example embodiment, the rising edge of the pulse on line WE1 results in the data on the bus register data in (0:31) being clocked into the flip-flops of register 1. Additionally, the pulse on the line memory write enable results in the data on bus memory data in (0:31) being stored in the SRAM (block 213 of FIG. 2) at word location 1. As described hereinabove, in the normal operating mode of circuit 241, the data on the buses labeled memory data in (0:31) and register data in (0:31) is the same and equivalent to the data on the bus data in (0:31). Also as described hereinabove, a pulse on the line write enable of FIG. 2 results in a pulse occurring approximately simultaneously on the lines register write enable and memory write enable. With the data of both of these buses being the same and the pulses occurring approximately simultaneously on the lines register write enable and memory write enable, register1 (block 203) and the word at location 1 of the SRAM (block 213 of FIG. 2) contain the same data at the completion of the write operation.

When circuit 241 of FIG. 2 is operating in the normal mode and a read operation occurs, an external circuit places the address of the word location in the SRAM (block 213 of FIG. 2) to be read on the bus address (0:8) of FIG. 2. This address is output to the bus internal address (0:8) by the controller (block 215 of FIG. 2) as described hereinabove. The contents of the word of the SRAM (block 213) corresponding to the address on bus internal address (0:8) is output to the 32 bit bus labeled "data out (0:31)" in FIG. 2. The bus data out (0:31) is coupled to the data outputs of the SRAM (block 213). The bus data out (0:31) is also coupled to an external circuit such as the data inputs a microprocessor. The control register of the register set 231 corresponding to the address on the bus internal address (0:8) is not read and is not output from circuit 241 by the read operation. As described hereinabove, both the control register and the word of the SRAM block 213 in FIG. 2 corresponding to the address on the bus internal address (0:8) contain the same data after the occurrence of a previous write operation to this same address. Thus a read operation of a word location in the SRAM (block 213) outputs data to the bus data out (0:31) that should be (assuming no errors have occurred) identical to the contents of the control register corresponding to the same address of this word location. For example, when the content of the word at address 1 in the SRAM (block 213) is output to the bus data out (0:31), the data on this bus is equivalent to the content of register1 (block 203 of FIG. 2). There are cases where the content of a word in the SRAM (block 213) may not be equivalent to the content of the corresponding control register. Such cases can be caused by errors due to circuit noise or other causes. Additionally, the content of the control registers of register set 231 and the SRAM (block 213) may differ after an event such as power up that places the control registers in an unknown or default state. After such events or when an error occurs, write operations described hereinabove, or enabling the bulk data restoration mode described hereinbelow can be used to make the SRAM (block 213) content and the content of the control registers of register set 231 equivalent.

As described hereinabove, the content of control registers in the register set 231 are not output by the embodiment control register circuit 241 of FIG. 2 to an external circuit such as a microprocessor by a read operation. Therefore, the data outputs of the control registers in the register set 231 are not coupled to a circuit such as a "read multiplexer". If a read multiplexer were present it would be employed to output the data stored within the control registers of the register set 231 during a read operation. Such a read multiplexer, if present, would be coupled to the register set 231 with 512 buses of 32 bits each, or 16.384 individual lines. For the embodiment circuit 241 of FIG. 2 implemented in an integrated circuit, a large number (such as 16,384) of individual lines when routed between each control register bit and circuit elements of a read multiplexer, if present, cause significant routing congestion. Significant routing congestion can increase the integrated circuit area required to implement the embodiment, as well as result in timing requirements not being met. As described hereinabove, the example embodiment in FIG. 2 employs an SRAM (block 213 of FIG. 2) to store a "copy" of the data in control registers of the register set 231 of FIG. 2. SRAM 213 outputs the copy of the data stored in a control register during a read operation as described hereinabove, thus eliminating the need for a read multiplexer, and the lines coupled to it. The integrated circuit area consumed by the SRAM may be significantly less than the area consumed by a read multiplexer and lines coupled to the read multiplexer. In addition, the employment of the SRAM will typically improve performance with respect to timing requirements of the embodiment and circuits coupled to the embodiment.

When the example embodiment of circuit 241 of FIG. 2 is operating in the bulk data restoration mode, all data in the SRAM (block 213 of FIG. 2) is written into the set of control registers 231 of FIG. 2. In an example, the bulk data restoration mode can be used when the embodiment circuit 241 transitions from a low power state to full power operation. Such a use of the embodiment bulk data restoration mode is possible when the SRAM (block 213 of FIG. 2) is implemented to retain data while circuit 241 is in a low power state. The bulk data restoration mode can also be used at other times such as to correct data errors in the set of control registers 231 of FIG. 2.

When the example embodiment circuit 241 of FIG. 2 is operating in the bulk data restoration mode, the controller (block 215 of FIG. 2) performs the functions now described. The signals on the line write enable and the buses data in (0:31) and address (0:8) are blocked by the controller (block 215 of FIG. 2) and do not affect the operation of circuit 241. For an addresses corresponding to a control register in the set of registers 231 and the corresponding word location in the SRAM (block 213), the controller (block 215) first reads the content of the word in the SRAM (block 213). This content is then written to the control register in the set of registers 231 corresponding to this same address. For the example embodiment circuit 241, these two functions are performed by block 215 for addresses in the range 0 to 511. To perform the read from a location in the SRAM (block 213) followed by a write to the register set 231, block 215 outputs an address on bus internal address (0:8). This address on bus internal address (0:8) results in the content of the SRAM (block 213) for the word corresponding to this address to be output to the bus data out (0:31). The bus data out (0:31) is coupled to inputs of block 215. The data on bus data out (0:31) is output without modification to the bus register data in (0:31) by block 215. Block 215 then generates a pulse on the line register write enable. This pulse propagates through the demultiplexer 207 to the demultiplexer output line corresponding to the address on the bus internal address (0:8). This demultiplexer output line is also coupled to the clock input of the control register in the register set 231 corresponding the address on the bus internal address (0:8). The rising edge of the pulse on the clock input of this control register results in the data on bus register data in (0:31) being written to this control register. The block 213 then outputs a different address to the bus internal address (0:8). The sequence of addresses can be monotonically increasing starting at address 0 and ending with address 511. Other sequences of addresses can be used, provided that all addresses for the control registers to be restored are included (addresses 0 through 511 in this example.) The cycle described hereinabove of reading a word from the SRAM block 213 and writing the content of that word to the corresponding control register is repeated. The repetition of this cycle stops after the cycle has been completed for all control registers to be restored in the set of registers 231. Less than all of the registers could also be written in a given example implementation, if desired.

A state machine or other circuit can be implemented as part of block 215 to perform the functions of block 215 described hereinabove when the bulk data restoration mode is active. A clock signal on line labeled "clock" in FIG. 2 establishes the timing for the hereinabove described functions when the bulk data restoration mode is active. The signal clock is generated external to FIG. 2. The clock signal on the line clock of FIG. 2 is employed by block 215 to time the transition between addresses output on the bus internal address (0:8) as described hereinabove and to generate the pulse on the line register write enable as described hereinabove.

When the example embodiment of FIG. 2 is operating in the bulk data error check mode, the parity of the words of the SRAM (block 213 of FIG. 2) are compared to the parity of corresponding registers in the set of control registers 231 of FIG. 2. When the parity of a word in the SRAM block 213 does not match the parity of the corresponding control register in the set of registers 231 a high logic level is output on the line labeled "parity error" in FIG. 2. The line parity error is coupled to an external circuit such as a microprocessor. The bulk data error check mode can be used to increase system reliability. A system employing the example embodiment can be implemented to perform specific functions external to circuit 241 of FIG. 2 when a parity error occurs. An example of such a function is writing data to the control registers to over write errors that may exist in the content of the registers. A second example is reading data from the SRAM (block 213 of FIG. 2) to identify errors that may exist in the data stored in block 213.

When the example embodiment of FIG. 2 is operating in the bulk data error check mode the controller (block 215 of FIG. 2) performs the functions described herein below. Signals write enable and the buses data in (0:31) and address (0:8) are blocked by the controller (block 215) and do not affect the operation of circuit 241. For addresses in the range 0 to 511 (other address ranges are possible for alternative embodiments), the controller (block 215) outputs an address on bus internal address (0:8). The content of the SRAM (block 213 of FIG. 2) for the word corresponding to this address is output by the block 213 to the bus data out (0:31). The bus data out (0:31) is coupled to inputs of the block "memory parity" (219 of FIG. 2). The output of the memory parity circuit (block 219) is coupled to the line labeled "word parity" in FIG. 2. The line word parity is also coupled to an input of a comparator circuit (217 of FIG. 2). The bus internal address (0:8) is coupled to the select inputs of the multiplexer (block 216 of FIG. 2). The multiplexer (block 216) selects the input of the multiplexer that corresponds to the address on the bus internal address (0:8). These multiplexer inputs are coupled to the parity outputs of the control registers in the register set 231 that also correspond to the address on the bus internal address (0:8). The state of the multiplexer (block 216) input corresponding to the address on bus internal address (0:8) is output by the multiplexer to the signal line labeled "register parity" in FIG. 2 coupled to the output of the multiplexer 216. The line register parity is also coupled to an input of the comparator (217 of FIG. 2). The comparator (217) outputs a logic low level on the line parity error when the states of the signals on the lines register parity and word parity are equivalent. The line parity error is coupled to the comparator (217) output. When the states of the signals on the lines register parity and word parity are not equivalent the comparator outputs a logic high on the line parity error. The block 215 then outputs a different address to the bus internal address (0:8). The sequence of addresses can be monotonically increasing starting at address 0 and ending with address 511. Other sequences of addresses can be used provided all addresses in the range 0 to 511 are included. For example, a non-monotonic counter, such as a linear feedback shift register, can be used to advance the sequence. The cycle described hereinabove of comparing the parity of a word of the SRAM (block 213) to the parity of the corresponding control register is repeated. The repetition of this cycle stops after the cycle has been completed for all control registers in the set of registers 231. Alternate embodiments can be implemented to perform the bulk error check function on address ranges other than 0 to 511.

The parity outputs of the control registers register0, register1, and register511 (blocks 201, 203, and 205 respectively of FIG. 2) are coupled to the lines RP0, RP1, and RP511 respectively in FIG. 2. The lines coupled to the parity outputs of the control registers corresponding to addresses 2 through 510 are not explicitly illustrated in FIG. 2 but are present as indicated by the dots between lines RP1 and RP511. The parity output of control registers in register set 231 is generated by a circuit present within each register. These parity generation circuits within the control registers employ the same functionality as the memory parity circuit (block 219 of FIG. 2). The lines RP0, RP1, and RP511 are coupled to the inputs of the multiplexer (block 216) that correspond to addresses 0, 1, and 511 respectively. The inputs to the multiplexer (block 216) coupled to the parity outputs of the control registers in the register set 231 corresponding to addresses 2 through 510 are not explicitly illustrated in FIG. 2 but are present as indicated by the dots between lines RP1 and RP511 of FIG. 2.

A state machine or other control circuit can be implemented as part of block 215 of FIG. 2 to perform the hereinabove described functions of block 215 when the bulk data error check mode is active. A clock signal on the line clock of FIG. 2 establishes the timing for the hereinabove described functions when the bulk data error check mode is active. The clock signal is generated external to FIG. 2. The clock signal on the line clock of FIG. 2 is employed by block 215 to time the transition between addresses output to the bus internal address (0:8) as described hereinabove. Alternative embodiments can be implemented that encode the parity of the control registers and words of the SRAM using either odd or even parity. In addition, alternative embodiments can be implemented employing other error detection coding approaches. These alternative approaches can include those that produce more than one error detection bit. Implementation of these alternative embodiments may result in corresponding modifications to circuit 241 of FIG. 2. In one alternative approach, error detection and correction (EDAC) can be incorporated with the embodiments. In this approach, single bit errors in a control register can be corrected automatically.

Alternative embodiments can be implemented that provide additional information to an external circuit such as a microprocessor when a parity error occurs. For example, such an alternative embodiment can be implemented with an additional circuit (not shown) that stores the address on the bus internal address (0:8) of FIG. 2 to an additional register when a parity error occurs. This register can be read by an external circuit such as a microprocessor. Such an alternative embodiment can be used by the external circuit to identify specific control registers of register set 231 and locations of words of the SRAM (block 213 of FIG. 2) that failed the parity comparison. Thus, for example, write operations as described hereinabove to the control register circuit (241 of FIG. 2) at specific addresses can be performed by the external circuit to correct data in the control registers and SRAM.

An alternative embodiment may be implemented without parity or other error detection approaches. The modifications to circuit 241 of FIG. 2 for this alternative embodiment result in the following circuit elements and lines being omitted: the lines parity enable, word parity, register parity, and parity error; the blocks 216, 217, and 219; parity generation circuits included in the control registers of register set 231 and the associated parity output of each control register; the lines coupling the parity output of each control register to the inputs of multiplexer (block 216); and the circuits of block 215 that perform the function (described hereinabove) of the bulk data error check operating mode of circuit 241. For this alternative embodiment, the normal operating mode is active when the signal on the line load enable is low, and the bulk data restoration mode is active when the signal on the line load enable is high.

For a system implemented with the embodiment control register circuit 241 illustrated in FIG. 2, additional input signals may be required. Such an additional input signal is a select signal that enables the control register circuit for both individual read and write operations. In addition, for a control register circuit implemented with the SRAM (block 213 of FIG. 2) having retention capability, input signals may be required to transition between the retention and normal operation states. Further, additional input signals may be required to disable the output signal on the line parity error when the bulk data error check mode is not active. These example additional input signals are not further described herein for simplicity of explanation.

For cases where the signal on the line parity error is not disabled during a read operation when operating in the normal mode an alternative embodiment is formed. This alternative embodiment outputs a logic high on the line parity error of FIG. 2 during a read operation when the parity of the word read from the SRAM (213 of FIG. 2) is not equivalent to the parity of the corresponding control register of the register set 231 in FIG. 2. This logic high on the line parity error of FIG. 2 can be used to notify the external microprocessor (or other controller) that the current read operation generated a parity error. This alternative embodiment can beneficially use odd or even parity. In additional alternative embodiments, corrective error detection can be used instead of parity, including error detection that produces one or more error detection bits. In a further alternative, embodiments may incorporated error detection and correction (EDAC) techniques instead of parity.

The embodiment control register circuit (241 of FIG. 2) can be included in a circuit library for inclusion in different integrated circuit implementations employing different microprocessors (or other controllers) coupled to the embodiment. Additionally, the embodiment can be coupled to different microprocessors (or other controllers) on circuit boards or within packaging that includes multiple integrated circuits, such as multi-chip modules and stacked die packages. These microprocessors (or other controllers) are typically associated with memory systems that may include RAM. These microprocessors (or other controllers) and these memory systems are external to the embodiment. The SRAM (block 213 of FIG. 2) is not included in these external memory systems and is dedicated to the embodiment. Employment of this dedicated memory in the embodiment as opposed to another approach, such as use of RAM space in an external memory system, reduces adaptation requirements when incorporating the embodiment control register circuit in different system implementations. These reduced adaptation requirements may include, for example, reduced levels of effort to develop or modify a software driver for a microprocessor (or other controller) coupled to the embodiment for a specific system implementation. In addition, as described hereinbelow, the embodiment implemented with an internal dedicated SRAM (block 213) results in improved performance of the read modify write operation for systems employing multiple microprocessors (or other controllers) coupled to the embodiment. The dedicated SRAM (block 213) also results in improved performance of the bulk data restoration and bulk data error check modes.

The embodiment control register circuit 241 of FIG. 2 can be coupled to two or more microprocessors (or other controllers) external to circuit 241. For such a system configuration, the read modify write capability described hereinabove can be used by any of these microprocessors (or other controller) to change a subset of the bits of a control register (of register set 231 in FIG. 2) and the corresponding word of the SRAM (block 213 of FIG. 2). This control register and SRAM word location will have typically been previously populated with data by a write operation performed by one of these microprocessors (or other controller). The read modify write capability can be used such that only a subset of bits are changed, and the remaining bits of the register and word of the SRAM (block 213) are not changed. Thus these microprocessors (or other controllers) can operate independently when modifying portions of control registers. This independent operation does not include an arbitration function that grants access to the control register circuit. This arbitration function is not part of the embodiment and not described herein for simplicity of explanation. However, an arbitration function can be added to the embodiments. As described hereinabove, a read modify write operation is a read operation followed by a write operation both for the same address. Read and write operations are described hereinabove. The read operation reads the word from the SRAM (block 213) corresponding to a control register address. The content of this word of the SRAM (block 213) is the current content of the corresponding control register.

Thus communication between the microprocessors is not necessary to obtain the current content of the control register. Following the read operation, the microprocessor (or other controller) performing the read modify write modifies the subset of bits to be changed. The remaining bits are not changed. This microprocessor then writes this modified content to the control register circuit (241 of FIG. 2) using the same address that was used for the read portion of the operation. The modified content contains both the modified subset of bits and the remaining unchanged bits. As described hereinabove the write operation writes to both the control register and the corresponding word of the SRAM (block 213). The SRAM (block 213) is part of and dedicated to the embodiment control register circuit (241) and not part of the external memory systems. Therefore, the current content of the control register can be read from and written to the SRAM (block 213 of FIG. 2) with an approach that is independent of the implementation of the memory systems external to the embodiment. In addition, this independence from the external memory systems results in less extensive adaptation, such as software modifications, when implementing different systems incorporating the embodiment control register circuit.

As described hereinabove, both the bulk data restoration and the bulk data error check modes operate by accessing addresses in a range, such as 0 to 511. The embodiment (circuit 241 of FIG. 2) can be implemented such that all functions of these two modes for a specific address can be completed in a single cycle of the clock signal on the line clock (of FIG. 2). Thus these modes can be completed in approximately 512 clock cycles for an address range of 0 to 511. To access a word in a memory system external to the embodiment and associated with a microprocessor (or other controller) typically requires more time than a single period of the clock. This additional time may be associated with delays such as longer access times for large RAMs and memory arbitration delays. Thus for an alternative implementation that uses RAM space of an external memory system and where the SRAM (block 213) is not present in the embodiment, increased time may be required to complete the bulk data restoration and the bulk data error check modes. The embodiments provide the ability to rapidly restore data to the control registers and to perform an error check on the control registers without using resources in a microprocessor or controller to perform these tasks, and without the need for a sequence of external read and write operations.

Figure 3:
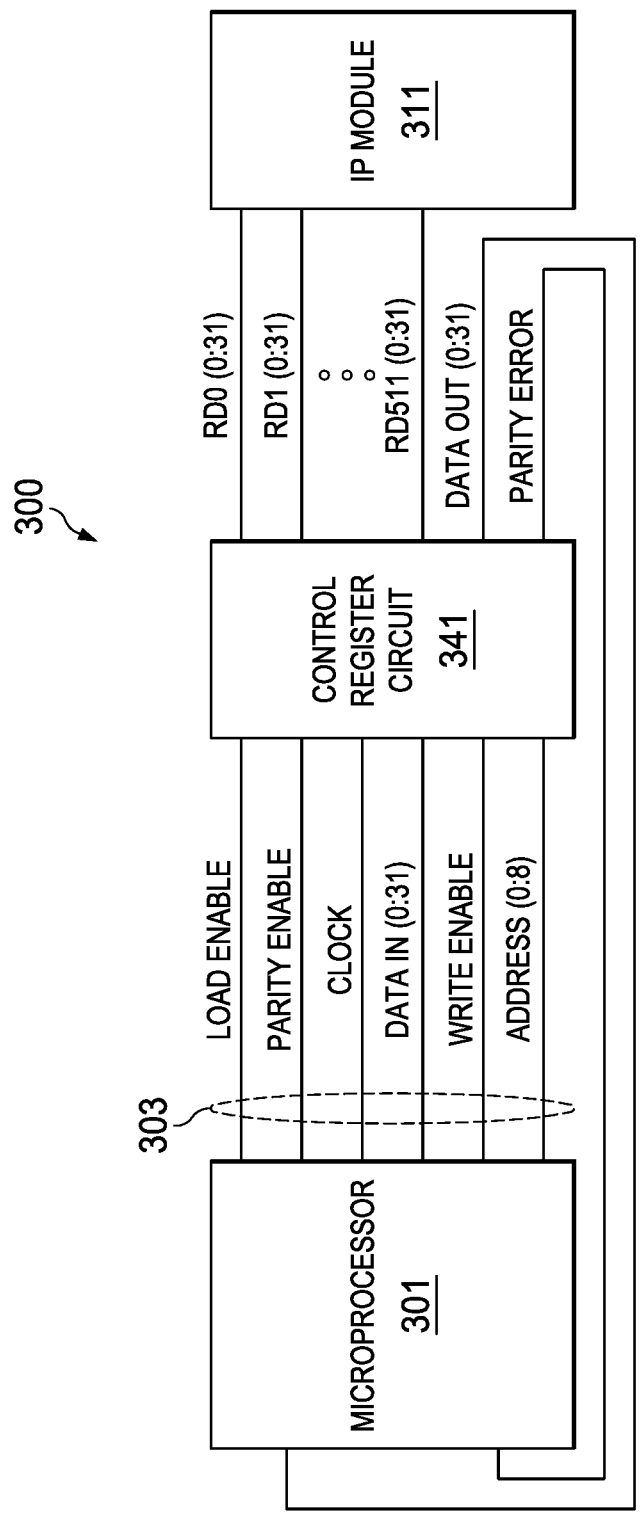
FIG. 3 is a block diagram of a circuit that includes an example embodiment control register circuit coupled to a microprocessor.

FIG. 3 is a block diagram of circuit 300 that includes an example embodiment "control register circuit" (block 341 of FIG. 3) and a "microprocessor" (block 301 of FIG. 3). In an example implementation, the circuit 300 can be formed as a single integrated circuit. In additional example implementations, the circuit 300 can be formed using multiple integrated circuits and/or discrete components on a board or a module. Multiple integrated circuits can be packaged in a single unit, such as stacked die packages or multichip modules, for ease of use and to further increase integration. User defined semi-custom integrated circuits including FPGAs, CPLDs, and ASIC devices can be used to implement the circuit of FIG. 3. Custom integrated circuits can also be used. The microprocessor 301 can include reduced instruction set computer (RISC) cores or ARM' cores. DSP and MSP cores can be used with additional functionality to implement circuit 300 in a single integrated circuit, or in multiple integrated circuits.

The circuit 300 of FIG. 3 employs circuits corresponding to those illustrated in FIG. 2 as described hereinbelow. The "control register circuit" (block 341) in FIG. 3 corresponds to circuit 241 of FIG. 2. Block 311 of FIG. 3, labeled "IP module," corresponds to block 211 of FIG. 2. The group of lines and buses 303 of FIG. 3 correspond to the input lines and buses coupled to block 215 of FIG. 2. In particular, the lines and buses labeled "load enable," "parity enable," "clock," "data in (0:31)," "write enable," and "address (0:8)" in FIG. 3 correspond the lines and buses labeled with the same names in FIG. 2. The 32 bit bus labeled "data out (0:31)" in FIG. 3 corresponds to the bus data out (0:31) of FIG. 2. The line labeled "parity error" in FIG. 3 corresponds to the line parity error of FIG. 2. Bus data in (0:31) is a 32 bit bus. Bus address (0:8) is a 9 bit bus.

The group of lines and buses 303 of FIG. 3 are coupled to outputs of the microprocessor (block 301 of FIG. 3) and coupled to inputs of the control register circuit (341 of FIG. 3). The bus data out (0:31) in FIG. 3 and the line parity error in FIG. 3 are coupled to inputs of the microprocessor (block 301) and to outputs of the control register circuit (block 341). Additional circuits coupled to the microprocessor such as memory blocks are not illustrated in FIG. 3 for simplicity of explanation. Circuit 300 of FIG. 3 may be coupled to external circuits such as a power supply, a host processor, and antennas. Such external connections are not illustrated for simplicity of explanation. Lines and buses coupling the microprocessor (block 301) to the IP module (block 311 of FIG. 3) are not illustrated in FIG. 3 for simplicity of explanation. These two blocks can be coupled for data transfers such as data written to "digital to analog" converters within block 311 and data read from "analog to digital" converters within block 311.

Certain microprocessors that can be used to implement block 301 of FIG. 3 may not be implemented with input and output signals that permit the control register circuit (block 341 of FIG. 3) to function as intended. The function of the control register circuit (block 341) is approximately equivalent to the functionality of the corresponding circuit 241 of FIG. 2 described hereinabove. An example of this incompatibility of microprocessor signals and input and output signals of the control register circuit (block 341) is that the microprocessor may employ a single bi-directional data bus and not separate input and output data buses as illustrated in FIG. 3. To resolve these incompatibilities, additional circuits may be required in circuit 300 of FIG. 3 to couple the blocks 301 and 341 of FIG. 3 for proper functionality of block 341. Such additional circuits are not described herein for simplicity of explanation. Including these additional circuits in circuit 300 external to the block 341 permits the embodiment to be employed in a system without modification or with limited modification to block 341. Thus the embodiment of FIG. 3 can be included in a circuit library for inclusion in different integrated circuit implementations employing different microprocessors. Additionally, the embodiment can be included in an integrated circuit used, for example, on circuit boards or within modules that employ different types of microprocessors.

The control register circuit (block 341 of FIG. 3) includes 512 control registers of 32 bits each that correspond to the register set 231 of FIG. 2. The 32 bit output of these 512 registers of the control register circuit (block 341) are coupled to circuits internal to the block 311 of FIG. 3. The 32 bit buses labeled "RD0 (0:31)," "RD1 (0:31)," and "RD511 (0:31)" in FIG. 3 couple output bits of three of these control registers to block 311. The buses coupling the remaining five hundred and nine control registers of block 341 are not illustrated in FIG. 3, but are present as illustrated by the dots between buses RD1 (0:31) and RD511 (0:31) of FIG. 3.

Alternative embodiments can be implemented with circuits or components that differ from those described hereinabove. For example, alternative embodiments can be implemented with the following: different input signals to control the example embodiment, different types of storage elements used within the control registers, different numbers of bits within the control registers, and different numbers of control registers. Alternative embodiments may require circuit modifications corresponding to such differences for operation of the control register circuit as intended.

Use of the embodiments results in a control register circuit with substantially lower integrated circuit area than prior approaches. Because the routing requirements are reduced in the embodiments by coupling only the memory output to the output data bus, and not the individual bits of the many control registers, the total routing area is greatly reduced. The elimination of an output block such as a multiplexer coupled to all of the control registers results in significant area savings. In an example implementation, a prior approach control register circuit required 102254.8 square microns for an initial area, while the control register implemented using an embodiment such as that of FIG. 2 was synthesized using the same design process to an initial area of 96425.3 square microns. The initial area is then expanded to complete the routing required in a place and route step. After placement, the prior approach control register circuitry and the associated routing required 184294.4 square microns, while the control register function routed using the embodiments resulted in an area of only 110478.7 square microns. In this example the layout "blow up" effect was greatly reduced by the lack of a need to route the outputs of the control registers to a central output data bus. The reduced area requirement results in a smaller integrated circuit die and corresponding lower costs to manufacture the integrated circuit die.

Use of the embodiments with the memory storing the values for the control registers also increases the response time after a wake up operation. The memory and controller internal to the embodiments enable a fast method to restore the data to all of the control registers, without the need for external commands from a processor or other controller. The time required to read the register values is also improved, as the routing delays associated with the prior approaches are eliminated by the use of the memory for reading the register values.

Figure 4:
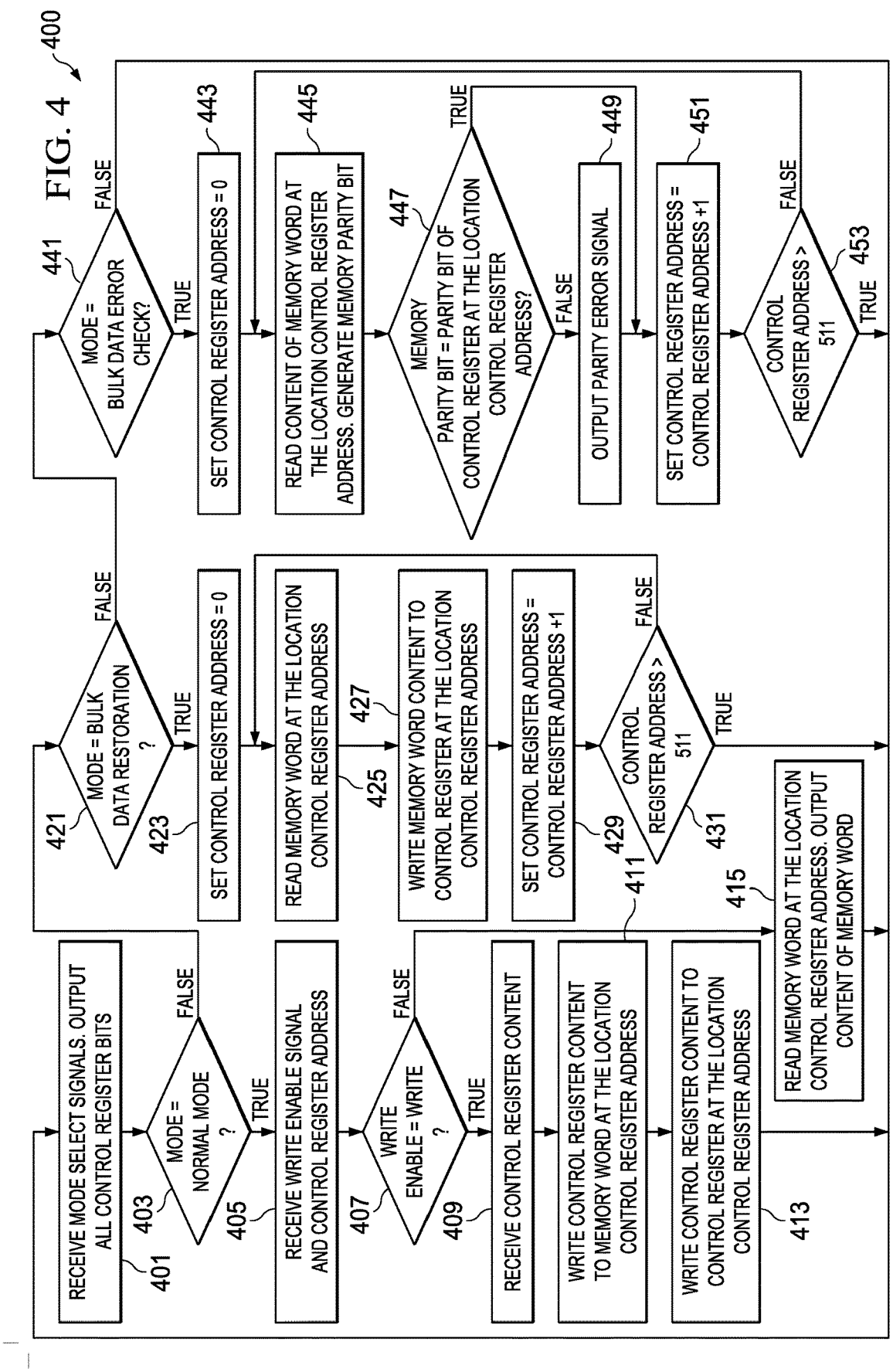
FIG. 4 illustrates in a flow diagram an example method embodiment.

FIG. 4 illustrates in a flow diagram an example method embodiment 400. Method 400 begins at step 401 in which mode select signals are received. In addition at step 401, the bits of all control registers are output by the method to a circuit being controlled. The circuit being controlled is not part of the embodiments. The control register bits are output continuously to the circuit being controlled while method 400 is functioning. From step 401 the method transitions to step 403.

At step 403 a comparison is made. If the mode status signals indicate that the mode is the "normal" mode, the comparison is true and the method transitions to step 405. At step 405 the write enable signal and the control register address are received. From step 405 the method transitions to step 407. At step 407 a comparison is made. If the write enable signal indicates that a write operation is to be performed, the comparison is true and the method transitions to step 409.

At step 409 the control register content is received. From step 409 the method transitions to step 411. At step 411 the control register content (see step 409) is written to the memory word at the location corresponding to the control register address (see step 405). From step 411 the method transitions to step 413. At step 413 the control register content (see step 409) is written to the control register corresponding to the control register address (see step 405). From step 413 the method transitions to step 401 and the method repeats. Returning to step 407, if the comparison is false a read operation is indicated, and the method transitions to step 415. At step 415 the content of memory word at the location corresponding to the control register address (see step 405) is read. This memory word content is output by the method. From step 415 the method transitions to step 401 and the method repeats.

Returning to step 403, if the comparison is false, the method transitions to step 421. At step 421 a comparison is made. If the mode status signals (see step 401) indicate that the mode is the "bulk data restoration" mode, the comparison is true and the method transitions to step 423. At step 423 the control register address is set to zero. From step 423 the method transitions to step 425. At step 425 the content the memory word at the location corresponding to the control register address (see steps 423 and 429) is read. From step 425 the method transitions to step 427. At step 427 the memory word content read from memory in step 425 is written to the control register corresponding to the control register address (see steps 423 and 429). From step 427 the method transitions to step 429. At step 429 the control register address (see step 423) is set to the current control register address incremented by 1. From step 429 the method transitions to step 431. At step 431 a comparison is made. If the current control register address value is greater than 511, the comparison is true, and the method transitions to step 401 and the method repeats.

Returning to step 431, if the comparison is false, the method transitions to step 425.

Returning to step 421, if the comparison is false, the method transitions to step 441. At step 441 a comparison is made. If the mode status signals (see step 401) indicate that the mode is the "bulk data error check" mode, the comparison is true, and the method transfers to step 443. At step 443 the control register address is set to zero. From step 443 the method transitions to step 445. At step 445 the content of the memory word at the location corresponding to the control register address (see steps 443 and 451) is read. Also at step 445 the "memory parity" bit is generated. The memory parity bit is a function of the memory word content. From step 445 the method transitions to step 447.

At step 447 a comparison is made. If the parity bit generated by the control register corresponding to the control register address (see steps 443 and 451) is equivalent to the memory parity bit generated in step 445, the comparison is true and the method transitions to step 451. It should be noted that all control registers continuously generate a parity bit that is a function of the content of the individual control register. Returning to step 447, if the comparison is false the method transitions to step 449. At step 449 the method outputs the "parity error" signal. From step 449 the method transitions to step 451. At step 451 the control register address (see step 443) is set to the current control register address incremented by 1.

From step 451 the method transitions to step 453. At step 453 a comparison is made. If the current control register address is greater than 511, the comparison is true, and the method transitions to step 401 and the method repeats.

Returning to step 453, if the comparison is false, the method transitions to step 445.

Returning to step 441, if the comparison is false the method transitions to step 401, and the method repeats.

Note that the order of steps illustrated in the example embodiment of FIG. 4 illustrate one approach to performing the method. Alternative embodiments can be formed using a different order of steps. For example, the order of steps 411 and 413 can be reversed. Similarly, steps 403, 421, and 441 can be performed in any order. Steps can be combined or can be performed in additional steps. An alternative embodiment can be implemented without the bulk data error check mode by eliminating the steps numbered 441 through 453, and with a false comparison at step 421 causing the method to transition to step 401. Alternative embodiments can be implemented with a control register address range different than 0 to 511 and with a noncontiguous address range by modifying steps 423, 429, 431, 443, 451, and 453. Alternative embodiments can be implemented with either odd or even parity generation approaches or with approaches that employ other error encoding methods. Alternative embodiments can be implemented that employ the same steps to initialize, increment, and test the current control register address for both the bulk data restoration and bulk data error check modes.

Modifications are possible in the described embodiments, and other additional arrangements are possible that form further embodiments within the scope of the claims.

What is claimed is:

1. A circuit device comprising:
  a controller that includes:
    a set of data inputs to receive a first set of data;
    a set of register data outputs to provide register data based on the first set of data; and
    a set of memory data outputs to provide memory data based on the first set of data;
  a set of control registers coupled to the controller, wherein each register of the set of control registers includes:
    a set of data inputs coupled to the set of register data outputs of the controller; and
    a set of data outputs;
  a memory coupled to the controller that includes:
    a set of data inputs coupled to the set of memory data outputs of the controller; and
    a set of data outputs coupled to the set of data inputs of the controller; and
  an error detection circuit coupled to the set of control registers and to the memory, the error detection circuit configured to generate an error output;
  wherein in response to the error output of the error detection circuit indicating an error, the controller is configured to store the first set of data in a first register of the set of control registers and in a first memory location of the memory, the first memory location corresponding to the first register.

2. The circuit device of claim 1, wherein the controller is operable to cause the first set of data to be written to a register of the set of control registers and to the memory.

3. The circuit device of claim 1, wherein:
  the controller further includes:
    a write enable input to receive a first write enable signal; and
    a register write enable output to provide a register write enable signal based on the first write enable signal;
  each register of the set of control registers includes a write enable input; and the circuit device further includes a decoder coupled to the controller and the set of control registers that includes:
an input coupled to the register write enable output of the controller; and
a set of outputs coupled to the write enable inputs of the set of control registers.

4. The circuit device of claim 3, wherein:
the controller further includes:
a set of address inputs to receive a first address signal; and
a set of address outputs to provide a second address signal based on the first address signal;
the memory includes a set of address inputs coupled to the set of address outputs of the controller; and
the decoder includes a control input coupled to the set of address outputs of the controller.

5. The circuit device of claim 4, wherein the controller is operable to cause data stored in the memory at a memory location that corresponds to a register of the set of control registers that corresponds to the first address signal to be output at the set of data outputs of the memory.

6. The circuit device of claim 1, wherein:
each register of the set of control registers further includes a parity output; and
the error detection circuit comprises:
a multiplexer that includes:
a set of inputs coupled to the parity outputs of the set of control registers; and
a multiplexer output;
a parity generator that includes an input coupled to the set of data outputs of the memory and an output; and
a comparator circuit that includes:
a first input coupled to the multiplexer output;
a second input coupled to the output of the parity generator; and
a parity error output.

7. The circuit device of claim 6, wherein the controller is operable to perform a parity check operation that includes:
causing the memory to provide a second set of data at the set of data outputs of the memory from a location in the memory that corresponds to a first register of the set of control registers, such that the parity generator provides a first set of parity data for the second set of data at the output of the parity generator; and
causing the first register of the set of control registers to provide a second set of parity data for the second set of data at the parity output of the first register, such that the comparator circuit:
receives the first set of parity data and the second set of parity data; and
provides a parity signal at the parity error output of the comparator circuit based on the first set of parity data and the second set of parity data.

8. The circuit device of claim 1, wherein the controller further includes a set of memory data inputs coupled to the set of data outputs of the memory.

9. The circuit device of claim 8, wherein the controller is operable to perform a data restoration operation that includes:
receiving, via the set of memory data inputs of the controller, a second set of data from a location in the memory corresponding to a first register of the set of control registers;
providing the second set of data at the set of register data outputs of the controller; and
causing the first register to store the second set of data.

10. The circuit device of claim 9, wherein the controller is operable to perform the data restoration operation in response to a transition between a first power state and a second power state.

11. The circuit device of claim 10, wherein the memory is operable to retain data in the first power state and the second power state.

12. The circuit device of claim 9, wherein the controller is operable to perform the data restoration operation in response to an error in the set of control registers.

13. A method comprising:
receiving, by a controller, a first set of data;
receiving, by the controller, a first address that corresponds to a first register of a set of control registers;
in response to the receiving of the first set of data, storing the first set of data in the first register;
in response to the receiving of the first set of data, storing the first set of data in a memory separate from the first register at a first memory location that corresponds to the first register;
receiving, by the controller, a read request at a requested address for the first set of data;
in response to the receiving of the read request, outputting contents of the memory corresponding to the requested address on a memory output line;
comparing, by an error detection circuit, a first error code associated with the contents of the memory on the memory output line with a second error code associated with a register corresponding to the requested address;
generating, by the error detection circuit, an error output based on the comparing; and
in response to the error output indicating an error:
receiving, by the controller, the first address and the first set of data; and
storing, by the controller, the first set of data in the first register and in the first memory location that corresponds to the first register.

14. The method of claim 13 further comprising:
receiving, by the controller, a second address that corresponds to a second register of the set of control registers; and
providing a second set of data stored in a second memory location of the memory that corresponds to the second register from the memory to a data output bus.

15. The method of claim 13 further comprising:
performing a data restoration operation that includes:
receiving, from the memory, a second set of data stored in a second memory location of the memory that corresponds to a second register of the set of control registers; and
storing the second set of data in the second register.

16. The method of claim 15, wherein the performing of the data restoration operation is performed in response to a transition between a first power state and a second power state.

17. The method of claim 15, wherein the performing of the data restoration operation is performed in response to a data error of the set of control registers.

18. The method of claim 13 further comprising:
performing a bulk data restoration operation that includes:
setting a pointer indicating an initial memory location of the memory;
reading, from the memory, a second set of data stored in a memory location that corresponds to the pointer;
storing the second set of data to a selected one of the set of control registers that corresponds to the pointer;

determining whether the memory location that the pointer corresponds to is a last address in an address range;

when the memory location is not the last address in the address range, changing the pointer; and repeating the reading from the memory, the storing, the determining, and the changing of the pointer, until the pointer reaches the last address in the address range.

19. The method of claim 13 further comprising:

receiving, from the memory, a second set of data stored in a second memory location of the memory that corresponds to a second register of the set of control registers;

generating a first set of parity data for the second set of data;

receiving, from the second register a second set of parity data for the second set of data; and determining whether a parity error is present by comparing the first set of parity data to the second set of parity data.

20. The method of claim 19, further comprising, in response to determining that the parity error is present, storing the second set of data in the second register.

* * * * *